United States Patent
Lee et al.

(10) Patent No.: US 11,482,450 B2
(45) Date of Patent: Oct. 25, 2022

(54) METHODS OF FORMING AN ABRASIVE SLURRY AND METHODS FOR CHEMICAL-MECHANICAL POLISHING

(71) Applicant: Taiwan Semiconductor Manufacturing Co., Ltd., Hsinchu (TW)

(72) Inventors: Chia Hsuan Lee, Hsinchu (TW); Chun-Wei Hsu, Hsinchu (TW); Chia-Wei Ho, Kaohsiung (TW); Chi-Hsiang Shen, Tainan (TW); Li-Chieh Wu, Hsinchu (TW); Jian-Ci Lin, Hsinchu (TW); Chi-Jen Liu, Taipei (TW); Yi-Sheng Lin, Taichung (TW); Yang-Chun Cheng, Hsinchu (TW); Liang-Guang Chen, Hsinchu (TW); Kuo-Hsiu Wei, Tainan (TW); Kei-Wei Chen, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/187,059

(22) Filed: Feb. 26, 2021

(65) Prior Publication Data

US 2021/0183688 A1    Jun. 17, 2021

Related U.S. Application Data

(63) Continuation of application No. 16/559,336, filed on Sep. 3, 2019, now Pat. No. 10,937,691.
(Continued)

(51) Int. Cl.
*H01L 21/768* (2006.01)
*H01L 21/3105* (2006.01)
(Continued)

(52) U.S. Cl.
CPC ........... *H01L 21/7684* (2013.01); *C09G 1/02* (2013.01); *H01L 21/02074* (2013.01);
(Continued)

(58) Field of Classification Search
CPC ........... H01L 21/7684; H01L 21/02074; H01L 21/31053; H01L 21/02175;
(Continued)

(56) References Cited

U.S. PATENT DOCUMENTS 6,482,743 B1   11/2002   Sato
9,105,490 B2    8/2015   Wang et al.
(Continued)

FOREIGN PATENT DOCUMENTS

CN    1854225 A    11/2006
CN    1993437 A     7/2007
(Continued)

*Primary Examiner* — Lan Vinh
(74) *Attorney, Agent, or Firm* — Slater Matsil, LLP

(57) ABSTRACT

Methods of forming a slurry and methods of performing a chemical mechanical polishing (CMP) process utilized in manufacturing semiconductor devices, as described herein, may be performed on semiconductor devices including integrated contact structures with ruthenium (Ru) plug contacts down to a semiconductor substrate. The slurry may be formed by mixing a first abrasive, a second abrasive, and a reactant with a solvent. The first abrasive may include a first particulate including titanium dioxide ($TiO_2$) particles and the second abrasive may include a second particulate that is different from the first particulate. The slurry may be used in a CMP process for removing ruthenium (Ru) materials and dielectric materials from a surface of a workpiece resulting in better WiD loading and planarization of the surface for a flat profile.

20 Claims, 5 Drawing Sheets

Related U.S. Application Data

(60) Provisional application No. 62/737,502, filed on Sep. 27, 2018.

(51) Int. Cl.
*C09G 1/02* (2006.01)
*H01L 21/02* (2006.01)

(52) U.S. Cl.
CPC .. *H01L 21/31053* (2013.01); *H01L 21/02175* (2013.01); *H01L 21/02244* (2013.01)

(58) Field of Classification Search
CPC ......... H01L 21/02244; H01L 21/67219; H01L 21/3212; C09G 1/02; C09K 3/1472
USPC ...... 438/691, 692, 693, 694; 252/79.1, 79.2, 252/79.3; 216/89, 90
See application file for complete search history.

(56) References Cited

U.S. PATENT DOCUMENTS

| | | |
|---|---|---|
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2006/0024967 A1 | 2/2006 | De Rege Thesauro et al. |
| 2006/0243702 A1 | 11/2006 | Minamihaba et al. |
| 2009/0035942 A1 | 2/2009 | White et al. |
| 2009/0124173 A1* | 5/2009 | Li ............ C23F 3/06 451/37 |
| 2014/0017893 A1* | 1/2014 | Minami ............ C23F 3/06 438/693 |
| 2015/0333010 A1 | 11/2015 | Zinn |
| 2016/0148883 A1 | 5/2016 | Zinn |
| 2017/0166780 A1* | 6/2017 | Kwon ............ C09K 3/1436 |
| 2018/0036859 A1* | 2/2018 | Lee ............ B24B 37/107 |
| 2018/0286699 A1* | 10/2018 | Lin ............ B24B 53/017 |

FOREIGN PATENT DOCUMENTS

| | | |
|---|---|---|
| CN | 101308790 A | 11/2008 |
| CN | 107033787 A | 8/2017 |
| TW | 200906999 A | 2/2009 |
| TW | 200938615 A | 9/2009 |

* cited by examiner

METHODS OF FORMING AN ABRASIVE SLURRY AND METHODS FOR CHEMICAL-MECHANICAL POLISHING

PRIORITY CLAIM AND CROSS-REFERENCE

This application is a continuation of U.S. patent application Ser. No. 16/559,336 filed on Sep. 3, 2019, entitled "Methods of Forming an Abrasive Slurry and Methods for Chemical-Mechanical Polishing," which claims the benefit of U.S. Provisional Application No. 62/737,502, filed on Sep. 27, 2018, which application is hereby incorporated herein by reference.

BACKGROUND

Generally, contacts down to a semiconductor substrate may be made by first forming a dielectric layer and then forming openings within the dielectric layer to expose the underlying substrate where contact is desired to be made. Once the openings have been formed, a barrier layer may be formed within the openings and conductive material may be used to fill the remainder of the openings using, e.g., a plating process. This plating process usually fills and overfills the openings, causing a layer of the conductive material to extend up beyond the dielectric layer.

A chemical mechanical polish (CMP) may be performed to remove the excess conductive material and the barrier layer from outside of the openings and to isolate the conductive material and the barrier layer within the openings. For example, the excess conductive material may be contacted to a polishing pad, and the two may be rotated in order to grind excess conductive material away. This grinding process may be assisted by the use of a CMP slurry, which may contain chemicals and abrasives that can assist in the grinding process and help remove the conductive material.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
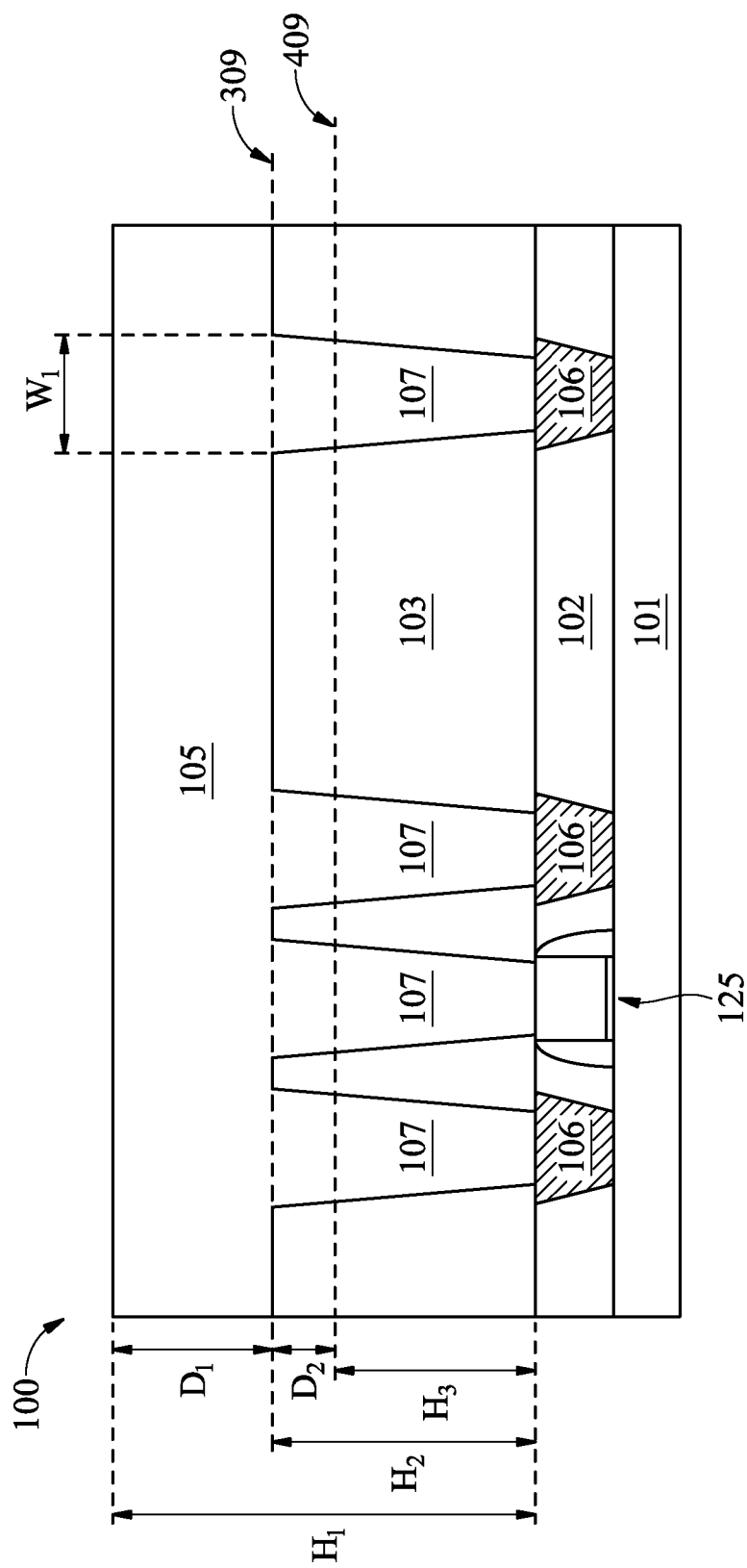
FIG. 1 illustrates a substrate with an overlying dielectric layer and contact openings overfilled with a conductive material, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments will be described with respect to embodiments in a specific context, namely slurry abrasives and chemical mechanical polishing (CMP) processes utilized in manufacturing semiconductor devices including integrated contact structures with ruthenium (Ru) plug contacts down to a semiconductor substrate. The embodiments may also be applied, however, to other metal contact structures and other CMP processes.

With reference now to FIG. 1, there is shown a workpiece 100 including a substrate 101, a first inter-layer dielectric (ILD) layer 102, source/drain plugs 106, active devices 125, a second inter-layer dielectric (ILD) layer 103, a second conductive fill material 105, a first target level 309 of a bulk CMP material removal process, and a second target level 409 of a buff CMP material removal process. However, any number of other suitable material layers may be included in the workpiece 100 and any desired number of target levels of any number of suitable CMP material removal processes may be applied.

The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

In addition, the substrate 101 may include active devices 125 formed within the substrate 101. As one of ordinary skill in the art will recognize, a wide variety of active devices 125 and passive devices (not shown) such as transistors, capacitors, resistors, combinations of these, and the like may be used to generate the desired structural and functional requirements of the design for a semiconductor device and may be formed using any suitable methods. For example, in some embodiments the active devices 125 may be FinFET devices, wherein fins of semiconductor materials are formed with gate stacks over fins of the FinFET devices with shallow trench isolation (STI) regions formed between fins and with source/drain regions formed within the fins on opposite sides of the gate stacks. The STI regions and source/drain regions are not separately illustrated for clarity.

The first ILD layer 102 may be formed over the substrate 101 in order to provide electrical isolation between the substrate 101 and overlying metallization layers (e.g., inter-metal dielectrics (IMD), redistribution layers, back end of the line (BEOL) metallization layers, or the like). The first ILD layer 102 may be a dielectric film formed, for example, by chemical vapor deposition, sputtering, or any other methods known and used in the art for forming an ILD. The first ILD layer 102 may have a planarized surface and may be comprised of dielectric materials such as doped or undoped silicon oxide, silicon nitride, doped silicate glass, other high-k materials, combinations of these, or the like, could be utilized. In an embodiment the first ILD layer 102 may comprise a material such as boron phosphorous silicate glass (BPSG), although any suitable dielectrics may be used for either layer. The first ILD layer 102 may be formed using a process such as CVD, PVD, PECVD, although other processes, such as LPCVD, may also be used.

After formation, the first ILD layer 102 may be planarized using, e.g., a chemical mechanical polish (CMP) process in order to planarize the first ILD layer 102. However, any other suitable planarization process may be used to reduce the first ILD layer 102 to the desired height and to provide a flat profile for the first ILD layer 102.

Once the first ILD layer 102 has been formed, source/drain plugs 106 may be formed through the first ILD layer 102 to provide some of the electrical connections to the active devices 125. In an embodiment the formation of the source/drain plugs 106 may be initiated by first forming contact plug openings through the first ILD layer 102 to expose contact areas of the source/drain regions. For example, the exposed contact areas may be epitaxial regions in the source/drain regions of the active devices 125.

In an embodiment, the contact plug openings may be formed using a suitable photolithographic masking and etching process. However, any suitable process may be used to form the openings. Once the contact plug openings have been formed in the first ILD layer 102, a formation of a first glue layer (not separately illustrated in FIG. 1) may be initiated. In an embodiment the first glue layer is utilized to help adhere the rest of the source/drain plugs 106 to the underlying structure and may be, e.g., ruthenium, tungsten, titanium nitride, tantalum nitride, or the like formed using a process such as CVD, plasma enhanced chemical vapor deposition (PECVD), physical vapor deposition (PVD), atomic layer deposition (ALD), and the like or the like.

Once the first glue layer has been formed, a first conductive fill material may be formed to fill the contact openings in the first ILD layer 102 and may be formed in contact with the first glue layer to provide an electrical connection to the active devices 125 formed within the substrate 101. In an embodiment the material of the first conductive fill material is ruthenium (Ru), although any other suitable material, such as tungsten, tungsten nitride, aluminum, copper, silver, gold, rhodium, molybdenum, nickel, cobalt, cadmium, zinc, alloys of these, combinations thereof, and the like, may be utilized. The first conductive fill material may be formed within the contact openings using a process such as plating (e.g., electroplating, electroless-plating), physical vapor deposition (PVD), chemical vapor deposition (CVD), plasma-enhanced chemical vapor deposition (PECVD), atomic layer deposition (ALD), combinations of these, or the like. In an embodiment, the first conductive fill material may be deposited in the contact openings formed through the first ILD layer 102 to fill and/or overfills the contact openings.

Once the first conductive fill material has been formed, the workpiece 100 may be subjected to one or more subsequent CMP removal processes (discussed in greater detail below) are used to planarize the first glue layer and/or the first conductive fill material with the first ILD layer 102. The CMP removal processes are discussed in greater detail below with regard to the remaining figures. Once planarized, the surface of the first ILD layer 102 and contact areas of the first conductive fill material are exposed at the outer surface of the workpiece 100. As such, source/drain plugs 106 are formed from remaining portions of the first conductive fill material which are isolated between sections of the first ILD layer 102, wherein contact areas of the source/drain plugs 106 are exposed and planarized with the first ILD layer 102 at the outer surface of the workpiece 100. Furthermore, any number of suitable CMP removal processes may be applied to the workpiece 100. According to some embodiments, the S/D plug 106 may be formed to a first width $W_1$ at a surface of the first ILD layer 102 opposite the substrate 101. In an embodiment, the first width $W_1$ may be between about 100 nm and about 1 nm, such as about 20 nm. However, any suitable width may be used.

Once the source/drain plugs 106 have been formed in the first ILD layer 102, the second ILD layer 103 is formed over the planarized surface of the first ILD layer 102 covering the contact areas of the source/drain plugs 106. The contact plugs 107 are formed in second ILD layer 103 to electrically connect the source/drain plugs 106 of the active devices 125. As such, the second ILD layer 103 provides electrical isolation between the first ILD layer 102 and overlying metallization layers (e.g., intermetal dielectrics (IMD), redistribution layers, back end of the line (BEOL) metallization layers, or the like). The second ILD layer 103, contact plug openings in the second ILD layer 103 used to form the contact plugs 107, and the contact plugs 107 may be formed using any of the materials, the deposition processes, the photolithographic masking and etching processes, and the planarization processes suitable for forming the first ILD layer 102, the contact openings in the first ILD layer 102, and the source/drain plugs 106, as set forth above.

According to an embodiment, the second ILD layer 103 and the contact plugs 107 formed within the second ILD layer 103 are formed using the same materials and the same processes for forming the source/drain plugs 106 in the first ILD layer 102, as set forth above. However, the materials, the deposition process, and the planarization process used to form the first ILD layer 102 and the second ILD layer 103 may also be different and any suitable dielectrics may be used for either layer. According to some embodiments, the second ILD layer 103 may be formed to a thickness of between about 5 nm and about 100 nm, such as about 50 nm. However, any suitable thickness may be used.

Once the second ILD layer 103 has been formed, contact plug openings and the contact plugs 107 may be formed through the second ILD layer 103 to electrically connect the source/drain plugs 106 of the active devices 125 formed in the substrate 101. In an embodiment, the formation of the contact plugs 107 may be initiated by first forming contact plug openings through the second ILD layer 103 to expose contact areas (not shown) of either the source/drain plugs 106, and/or gate electrodes of the active devices 125 isolated within the first ILD layer 102. In another embodiment, the contact areas at the surface of the first ILD layer 102 may be contacts of a redistribution layer (not shown) that are electrically coupled to either the source/drain regions or else the gate electrodes of the active devices 125 isolated within the first ILD layer 102. The contact plug openings may be formed to a first width $W_1$ at a surface of the second ILD layer 103 opposite the first ILD layer 102. According to some embodiments, the first width $W_i$ may be between about 100 nm and about 1 nm, such as about 20 nm. However, any suitable width may be used.

Once the contact plug openings have been formed in the second ILD layer 103, formation of a second glue layer (not separately illustrated in FIG. 1) utilized to help adhere the rest of the contact plugs 107 to the underlying structure and the second conductive fill material 105 over the second glue layer may be formed to fill the contact plug openings in the second ILD layer 103 to provide an electrical connection to the first ILD layer 102. According to embodiments, the second glue layer and the second conductive fill material 105 may be formed using any materials and any processes suitable for forming the first glue layer and for depositing the first conductive fill material to form the source/drain plugs 106 in the first ILD layer 102, as set forth above. According to an embodiment, the first glue layer and the second glue layer are formed using the same material (e.g., ruthenium (Ru)) and are deposited using the same process (e.g., plasma enhanced chemical vapor deposition (PECVD)), although the materials and processes may also be different. According to an embodiment, the first conductive fill material and the second conductive fill material 105 are formed using the same material (e.g., ruthenium (Ru)) and are deposited using the same process such as plating (e.g., electroplating, electroless-plating), although the materials and processes may also be different.

In an embodiment, the second conductive fill material 105 may be deposited in the contact openings formed through the second ILD layer 103 and the deposition of the second conductive fill material 105 may be continued until the second conductive fill material 105 fills the contact openings and extends above the second ILD layer 103 to a first height $H_1$ above the first ILD layer 102. In an embodiment, the first height $H_1$ may be between about 10 nm and about 200 nm, such as about 60 nm. However, any suitable height may be used.

Once the second conductive fill material 105 has been formed, the workpiece 100 is prepared for subsequent CMP removal processes. In an embodiment, the workpiece 100 may be subjected to a first CMP removal process to remove a portion of the second conductive fill material 105 from an outer surface of the workpiece 100 above the second ILD layer 103 to a first target level 309 at a first depth $D_1$. In an embodiment, the first depth $D_1$ may be between about 100 nm and about 5 nm, such as about 10 nm. Accordingly, the portion of the workpiece 100 above the first ILD layer 102 may be reduced, for example, from the first height $H_1$ to a second height $H_2$. In an embodiment, the second height $H_2$ may be between about 100 nm and about 5 nm, such as about 50 nm. However, any suitable heights may be used. Furthermore, once the workpiece is reduced to the first target level 309, a surface of the second ILD layer 103 and contact areas of the second conductive fill material 105 that are isolated between sections of the second ILD layer 103 may be exposed at the outer surface of the workpiece 100.

Once the first CMP removal process has been performed, the workpiece 100 may be subjected to a second CMP removal process, according to some embodiments, for example, to planarize or smooth an outer surface of the workpiece 100 and/or to further reduce the height of the workpiece 100. According to an embodiment, the second CMP removal process may be performed, for example to remove portions of the second ILD layer 103 and portions of the second conductive fill material 105 isolated between sections of the second ILD layer 103 from an outer surface of the workpiece 100 above the first ILD layer 102 to a the second target level 409 at a second depth $D_2$. In an embodiment, the second depth $D_2$ may be between about 50 nm and about 1 nm, such as about 30 nm. Accordingly, the portion of the workpiece 100 above the first ILD layer 102 may be reduced, for example, from the second height $H_2$ to a third height $H_3$. In an embodiment, the third height $H_3$ may be between about 99 nm and about 4 nm, such as about 20 nm. However, any suitable heights may be used. Furthermore, once the workpiece is reduced to the second target level 409, a surface of the second ILD layer 103 and contact areas of the second conductive fill material 105 that are isolated between sections of the second ILD layer 103 may be exposed at the outer surface of the workpiece 100. Although two CMP removal processes and two target levels are described, any desired number of target levels and any number of suitable CMP removal processes may be applied to the workpiece 100.

Figure 2:
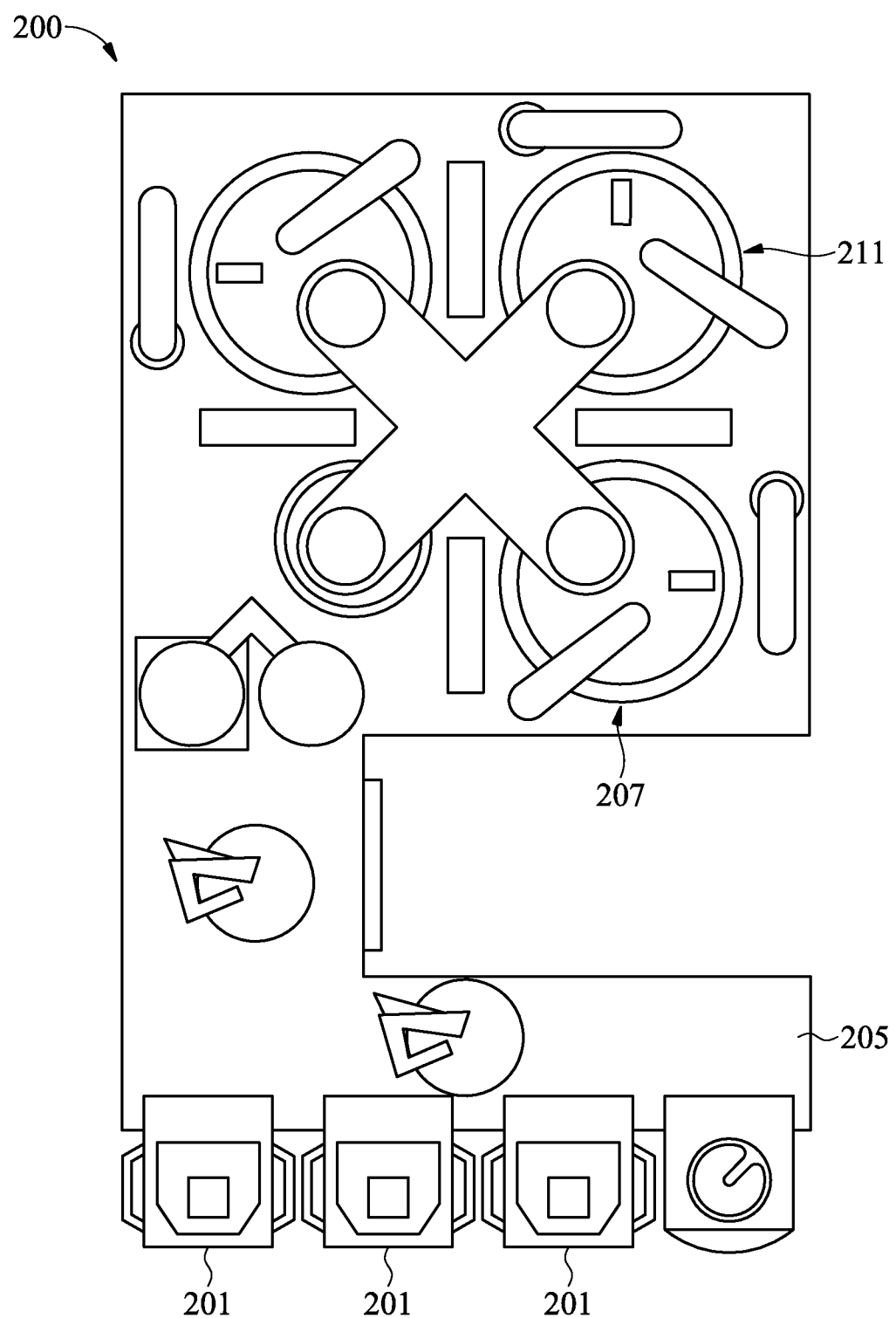
FIG. 2 illustrates a chemical mechanical polishing (CMP) system, in accordance with some embodiments.

FIG. 2 illustrates a CMP system 200 which may be used to remove the excess conductive fill material 105 and to remove the excess materials of the second ILD layer 103, thereby isolating the second conductive fill material 105 in the contact openings of the second ILD layer 103. The CMP system 200 may include loadlocks 201, cleaning station 205, a high-rate platen 207, and a buffing platen 211. The loadlocks 201 may be used for loading the workpiece 100 into the CMP system 200, and then unloading the workpiece 100 once the CMP process has been completed. The high-rate platen 207 may be used for polishing and removing the second conductive fill material 105 with a relatively high polishing rate, such as a bulk polishing rate, while the buffing platen 211 may be used for polishing and removing materials of the second ILD layer 103 and also to fix defects and scratches that may occur during the removal of the second conductive fill material 105.

Figure 3A:
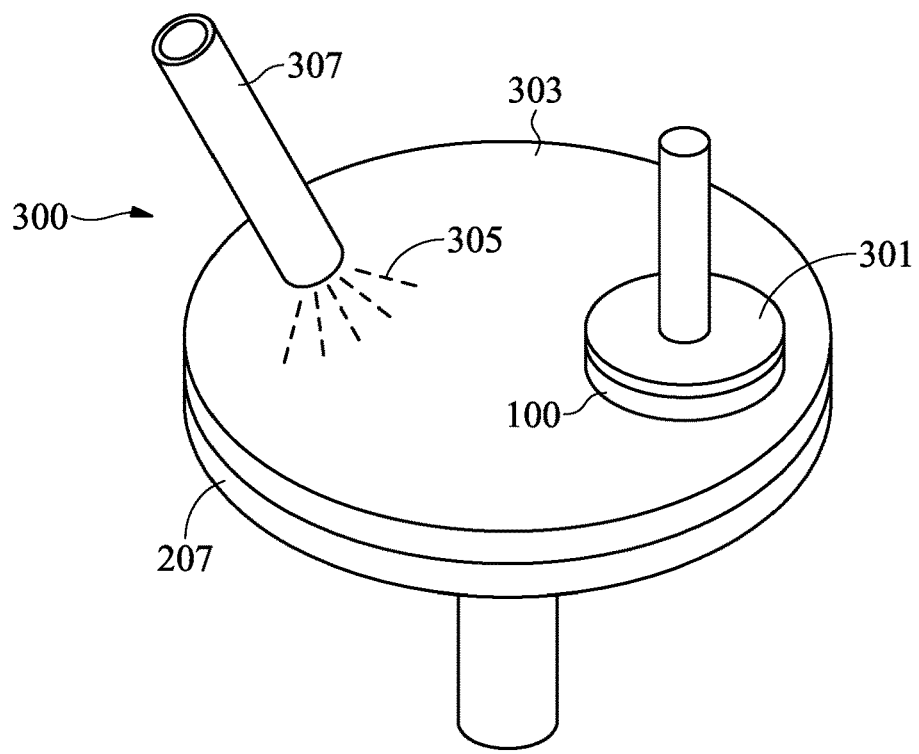
FIGS. 3A-3B illustrate a bulk CMP process and result, in accordance with some embodiments.
Figure 3B:
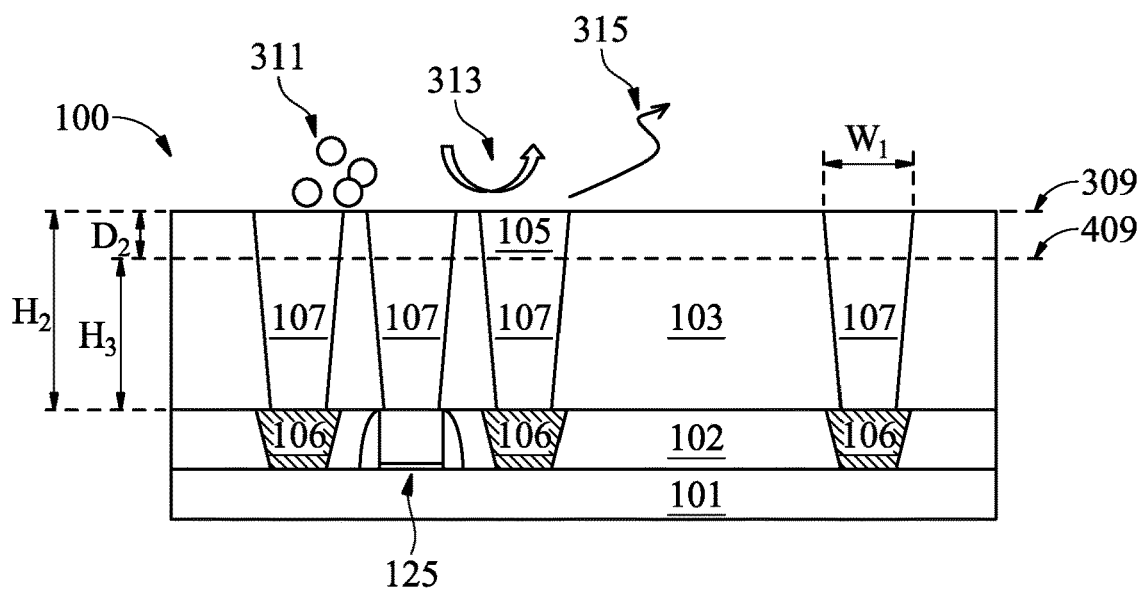

FIGS. 3A-3B illustrate the process and result of a bulk CMP process 300 performed on the workpiece 100. In an embodiment, the workpiece 100 may be loaded into the CMP system 200 through the loadlocks 201 and passed to the high-rate platen 207 for a bulk removal of the second conductive fill material 105 (see FIG. 2). Once at the high-rate platen 207 (as illustrated in FIG. 3A), the workpiece 100 may be connected to a first carrier 301, which faces the surface of the second conductive fill material 105 coincident the outer surface of the workpiece 100 towards a first polishing pad 303 connected to the high-rate platen 207.

The first polishing pad 303 may be a hard polishing pad that may be utilized for a relatively quick removal of the second conductive fill material 105. In an embodiment the first polishing pad 303 may be a single layer or composite layer of materials such as polyurethane or polyurethane mixed with fillers, and may have a hardness of about 50 or greater on the Shore D Hardness scale. The surface of the first polishing pad 303 may be a roughened surface with micropores within it. However, any other suitable polishing pad may be used to remove a bulk of the second conductive fill material 105 from the surface of the second ILD layer 103 (as illustrated in FIG. 3B).

During the bulk CMP process 300 the first carrier 301 may press the surface of the second conductive fill material 105 against the first polishing pad 303. The workpiece 100 and the first polishing pad 303 are each rotated against each other, either in the same direction or else counter-rotated in opposite directions. By rotating the first polishing pad 303 and the workpiece 100 against each other, the first polishing pad 303 mechanically grinds away the second conductive fill material 105, thereby effectuating a removal of the second conductive fill material 105. Additionally, in some embodiments the first carrier 301 may move the workpiece 100 back and forth along a radius of the first polishing pad 303.

Additionally, the mechanical grinding of the first polishing pad 303 may be assisted through the use of a bulk CMP slurry 305, which may be dispensed onto the first polishing pad 303 through a slurry dispensing system 307. In an embodiment the bulk CMP slurry 305 may comprise a reactant, an abrasive, a surfactant, and a solvent.

The reactant in the bulk CMP slurry 305 may be a chemical that will chemically react with the second conductive fill material 105 in order to assist the first polishing pad 303 in grinding away the second conductive fill material 105, such as an oxidizer. In an embodiment in which the second conductive fill material 105 is ruthenium (Ru), a first reactant 313 may be a weak oxidizer (e.g., $K_3Fe(CN)_6$, $FeNO_3$, or Br), such as, e.g., hydrogen peroxide ($H_2O_2$), although any other suitable reactant, such as guanidine, an amine, pyridine, combinations of these, and the like, that will aid in the removal of the second conductive fill material 105 may also be utilized. The first reactant 313 may be between about 20% by weight to about 0% by weight of the bulk CMP slurry 305, such as about 5% by weight of the bulk CMP slurry 305.

The abrasive 311 in the bulk CMP slurry 305 may be any suitable particulate that, in conjunction with the first polishing pad 303, aids in the removal of the second conductive fill material 105. In an embodiment the abrasive 311 may comprise a first particulate such as titanium dioxide ($TiO_2$) with a particle size of between about 300 nm and about 10 nm, such as 150 nm. Titanium dioxide ($TiO_2$) abrasives have a relatively high polish rate for ruthenium oxide ($RuO_2$) and a relatively low polish rate for dielectric materials (e.g., oxide film). Therefore, titanium dioxide ($TiO_2$) can polish ruthenium (Ru) using the relatively weak oxidizers (e.g., $H_2O_2$) which may prevent tool corrosion and can be safer for users in the environment and can be more friendly to the environment overall because relatively weak oxidizers (e.g., $H_2O_2$) may react with ruthenium such that non-toxic gases, for example, ruthenium hydroxide ($Ru(OH)_3$), are produced as a byproduct 315 instead of toxic gases (e.g., ruthenium tetroxide ($RuO_4$)).

Additionally, the abrasive 311 may be a hybrid abrasive including a combination of two or more particulates. For example, in addition to the first particulate, the abrasive 311 may also comprise a second particulate such as silica (e.g., silicon dioxide ($SiO_2$)) with a particle size of between about 300 nm and about 10 nm, such as 150 nm. Silicon dioxide ($SiO_2$) abrasives have a relatively low polish rate for ruthenium oxide ($RuO_2$) and a relatively high polish rate for dielectric materials (e.g., oxide film) as compared to some other abrasives (e.g., titanium dioxide ($TiO_2$)).

In still other embodiments, the second particulate may comprise alumina (e.g., aluminum oxide ($Al_2O_3$)) with a particle size of between about 300 nm and about 10 nm, such as 150 nm. However, any other suitable abrasive, such as cerium oxide, polycrystalline diamond, polymer particles such as polymethacrylate or polymethacryclic, combinations of these, or the like, may also be utilized and are fully intended to be included within the scope of the embodiments.

Furthermore, in the case where the abrasive 311 is a hybrid abrasive, the combination of particulates may be provided in different ratios of one particulate to another particulate. For example, the abrasive 311 may comprise a ratio of the first particulate (e.g., titanium dioxide ($TiO_2$)) to the second particulate (e.g., silicon dioxide ($SiO_2$)). In an embodiment, the abrasive 311 may have a ratio of titanium dioxide to silicon dioxide of 0 to 1 (or a ratio of titanium dioxide to aluminum oxide of 0 to 1) and may include 10 parts by volume of titanium dioxide ($TiO_2$) particles to 10 parts by volume of silicon dioxide ($SiO_2$) particles. For example, when polishing a material comprising ruthenium oxide ($RuO_2$) layers, the abrasive 311 may be chosen, according to some embodiments, to comprise a ratio of $TiO_2$ particles to $SiO_2$ particles to be within a range of between about 10,000 $TiO_2/SiO_2$ by volume and about 0.0001 $TiO_2/SiO_2$ by volume, such as about 1 $TiO_2/SiO_2$ by volume. However, any suitable ratio and any other suitable abrasive may be utilized and are fully intended to be included within the scope of the embodiments.

The surfactant may be utilized to help disperse the first reactant 313 and the abrasive 311 within the bulk CMP slurry 305 and also prevent the abrasive 311 from agglomerating during the bulk CMP process 300. In an embodiment the surfactant may include sodium salts of polyacrylic acid, potassium oleate, sulfosuccinates, sulfosuccinate derivatives, sulfonated amines, sulfonated amides, sulfates of alcohols, alkylanyl sulfonates, carboxylated alcohols, alkylamino propionic acids, alkyliminodipropionic acids, combinations of these, or the like. However, these embodiments are not intended to be limited to these surfactants, as any suitable surfactant may be utilized as the first surfactant. In an embodiment, the concentration of the surfactant in the bulk CMP slurry 305 may be between about 20% by volume and about 0% by volume, such as about 5% by volume of the bulk CMP slurry 305.

The remainder of the bulk CMP slurry 305 may be a solvent that may be utilized to combine the first reactant 313, the abrasive 311, and the surfactant and allow the mixture to be moved and dispersed onto the first polishing pad 303. In an embodiment the solvent of the bulk CMP slurry 305 may be a first solvent such as deionized water or an alcohol. However, any other suitable solvent may also be utilized as the first solvent. In an embodiment, the concentration of the solvent in the bulk CMP slurry 305 may be between about 99% by volume and about 70% by volume, such as about 95% by volume of the bulk CMP slurry 305.

In some embodiments, the bulk CMP slurry 305 may comprise other additives. For example, the bulk CMP slurry 305 may comprise a first additive that is a corrosion inhibitor. However, any other suitable additives may be utilized.

Embodiments of the bulk CMP slurry 305 disclosed herein refer to specific examples of reactants, abrasives, surfactants, solvents, and/or corrosion inhibitors. However, it is to be understood that any suitable reactant, abrasive, surfactant, solvent, and/or corrosion inhibitor may be utilized as the first reactant 313, the abrasive 311, the first surfactant, the first solvent, and/or the other additives without departing from the spirit and scope of the embodiments described herein.

Once mixed, the bulk CMP slurry 305 may be dispensed onto the first polishing pad 303 by the slurry dispensing system 307. In an embodiment, the bulk CMP slurry 305 may be dispensed onto the first polishing pad 303 at a rate of between about 2000 sccm and about 100 sccm. In addition, the workpiece 100 may be forced into contact with the first polishing pad 303 by the first carrier 301 pressing the surface of the workpiece 100 against the first polishing pad 303. In an embodiment of the bulk CMP process 300, the first carrier 301 may push the workpiece 100 onto the high-rate platen 207 with a force of between about 600 hpa to about 30 hpa, such as about 250 hpa. As the high-rate platen 207 rotates the first polishing pad 303 underneath the workpiece 100, the bulk CMP slurry 305 is applied to the exposed surface of the second conductive fill material 105 of the workpiece 100 in order to assist in the removal of the second conductive fill material 105. In an embodiment, during the bulk CMP process 300, the high-rate platen 207 rotates at a speed of between about 20 rpm to about 400 rpm and the first carrier 301 rotates the workpiece 100 at a speed of about 20 rpm to about 400 rpm.

By rotating the first polishing pad 303 and the workpiece 100 against each other using the bulk CMP slurry 305, the first polishing pad 303 along with the assistance of the abrasive 311 in the bulk CMP slurry 305 mechanically grind away the second conductive fill material 105, thereby effectuating a removal of the second conductive fill material 105 at a first rate of removal. In an embodiment, the first rate of removal of the second conductive fill material 105 is between about 10 Å per minute and about 2000 Å per minute, such as about 200 Å per minute. FIG. 3B illustrates a result after an embodiment of the bulk CMP process 300 has been performed in which the excess material of the second conductive fill material 105 has been removed from the surface of the workpiece 100.

Additionally, beyond just physically removing a portion of the second conductive fill material 105, the bulk CMP process 300 with the first reactant 313 and the abrasive 311 may react with material of the second conductive fill material 105 to form a sacrificial layer (not shown) along the exposed surface of the second conductive fill material 105. The sacrificial layer may then be removed by the grinding effect of the first polishing pad 303 along with the assistance of the abrasive 311 within the bulk CMP slurry 305. In particular, the first reactant 313 and the abrasive 311 may react with the surface of the second conductive fill material 105 to effectively boost the rate of removal of the second conductive fill material 105. In an embodiment in which the second conductive fill material 105 is ruthenium (Ru) and the first reactant 313 is an oxidizer (e.g., hydrogen peroxide ($H_2O_2$)), the first reactant 313 may react with the ruthenium (Ru) to form a material of the sacrificial layer (e.g., ruthenium oxide) as illustrated in Equation 1.

$$Ru + H_2O_2 \rightarrow RuOx \quad \text{Eq. 1.}$$

FIG. 3B shows, for example, the result of the bulk CMP process 300 performed on the workpiece 100 to remove a bulk of the second conductive fill material 105 extending above the surface of the second ILD layer 103. In an embodiment, a portion of the second conductive fill material 105 is removed during the bulk CMP process 300 such that the workpiece 100 is reduced from the first height $H_1$ (shown in FIG. 1) to the second height $H_2$ and such that a remaining portion of the workpiece 100, between the first target level 309 and the substrate 101, is left intact.

In addition, during the removal of the second conductive fill material 105, the materials of the bulk CMP slurry 305 and materials of the second conductive fill material 105 react such that a byproduct 315 may be formed. In some reactions between materials, the byproduct 315 may be formed as a vapor while in other reactions, the byproduct 315 may have a form different than a vapor (e.g., liquid, or solid). Furthermore, in some reactions between materials, the byproduct 315 may be formed as a toxic gas while in other reactions the byproduct 315 may be formed as a non-toxic gas.

In a specific embodiment, in which the second conductive fill material 105 is ruthenium (Ru), the first reactant 313 is hydrogen peroxide ($H_2O_2$), and the abrasive 311 is titanium dioxide ($TiO_2$), the byproduct 315 may be formed as ruthenium hydroxide ($Ru(OH)_3$) during the bulk removal of the second conductive fill material 105. The titanium dioxide ($TiO_2$) and the hydrogen peroxide ($H_2O_2$) may react with the ruthenium (Ru) to form ruthenium hydroxide ($Ru(OH)_3$), a non-toxic gas, as illustrated by Equation 2 and Equation 3.

$$Ru + TiO_2 + H_2O_2 \rightarrow Ti-O-Ru \text{ or } Ru-O-O-Ti. \quad \text{Eq. 2}$$

$$Ru^{3+}OH^- \xrightarrow{pH=8\sim11} Ru(OH)^3. \quad \text{Eq. 3}$$

In the instance that the byproduct 315 is formed as ruthenium hydroxide ($Ru(OH)_3$), this byproduct 315 is not considered to be toxic (e.g., non-toxic byproduct) and does not have the undesirable effects associated with toxic byproducts. In the instant case where the byproduct 315 is formed as ruthenium hydroxide ($Ru(OH)_3$), the process may allow for more environmentally friendly gasses to be emitted that are safer for the environment and safer for users in the environment. Thus, non-toxic byproducts of some embodiments of the CMP process may provide a safer environment for the users to work in, may allow for extended longevity of tool capabilities and/or may prevent corrosion of other metals within the surrounding environment.

In a specific embodiment in which the second conductive fill material 105 comprises ruthenium (Ru) and the abrasive 311 comprises silicon dioxide ($SiO_2$), using a first reactant 313 that comprises a relatively weak oxidizer (e.g., hydrogen peroxide $H_2O_2$) avoids the production of a toxic byproduct (e.g., ruthenium tetroxide ($RuO_4$)) which may be formed during the bulk CMP process 300 when using a first reactant that comprises a relatively strong oxidizer (e.g., iodate ($IO_3$—) or periodate ($IO_4$—)) such as sodium periodate $NaIO_4$. Ruthenium tetroxide ($RuO_4$) gas is considered to be a toxic gas that may be harmful to users in the environment and may have other undesirable effects, such as, destroying tool capabilities and/or corroding other metals within the surrounding environment.

FIG. 3B illustrates the result of the bulk CMP process 300. As illustrated, the bulk CMP process 300 uses the abrasive 311 and the first reactant 313 to aid in the removal of a bulk of the second conductive fill material 105 from the outer surface of the workpiece 100 to the first target level 309. As further illustrated in FIG. 3B, the resulting structure of the workpiece 100 includes contact plugs 107 formed from the second conductive fill material 105 isolated within the contact openings of the second ILD layer 103 with outer surfaces of the second conductive fill material 105 of the contact plugs 107 and outer surfaces of the second ILD layer 103 being coincident the outer surface of the workpiece 100. In an embodiment, the outer surfaces of the second conductive fill material 105 form contact areas (not illustrated) of the contact plugs 107 isolated within the second ILD layer 103, the contact areas having a width substantially equal to the first width $W_1$. However, any suitable widths may be used. In addition, during the bulk CMP process, the byproduct 315 may be formed from the chemical reactions between materials of the second conductive fill material 105, the materials of the abrasive 311, and the first reactant 313.

However, as one of ordinary skill in the art will recognize, the above description of removing the excess conductive fill material 105 above the first target level 309 in a single processing step is merely an illustrative example and is not intended to be limiting upon the embodiments. Any number of removal processes and any number of platens may be utilized to remove the second conductive fill material 105, and all such combinations are fully intended to be included within the scope of the embodiments.

Figure 4A:
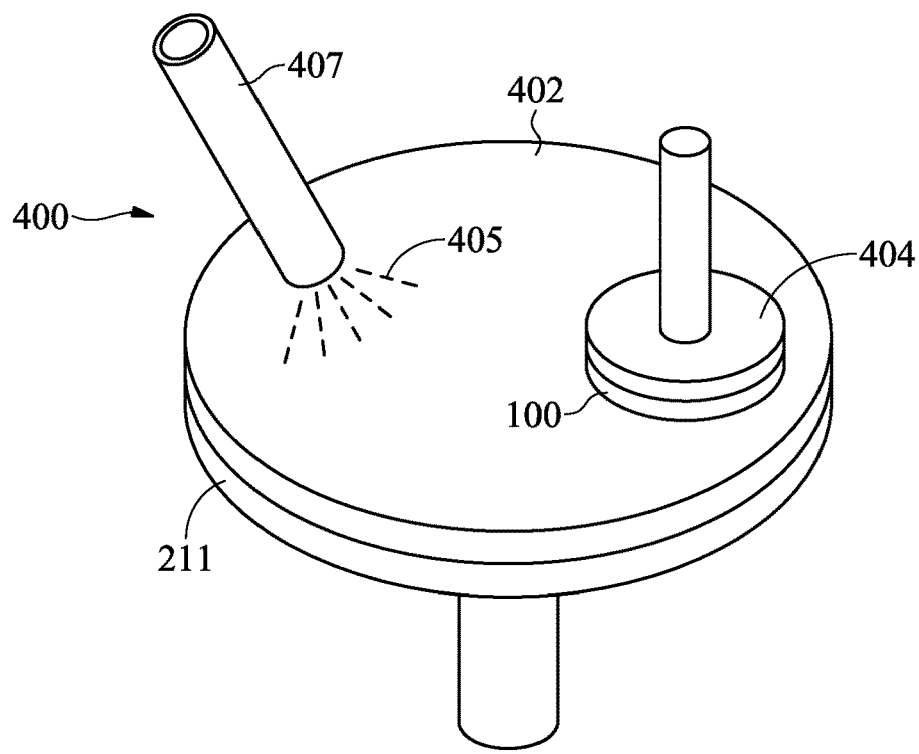
FIGS. 4A-4B illustrate a buffing CMP process and result, in accordance with some embodiments.
Figure 4B:
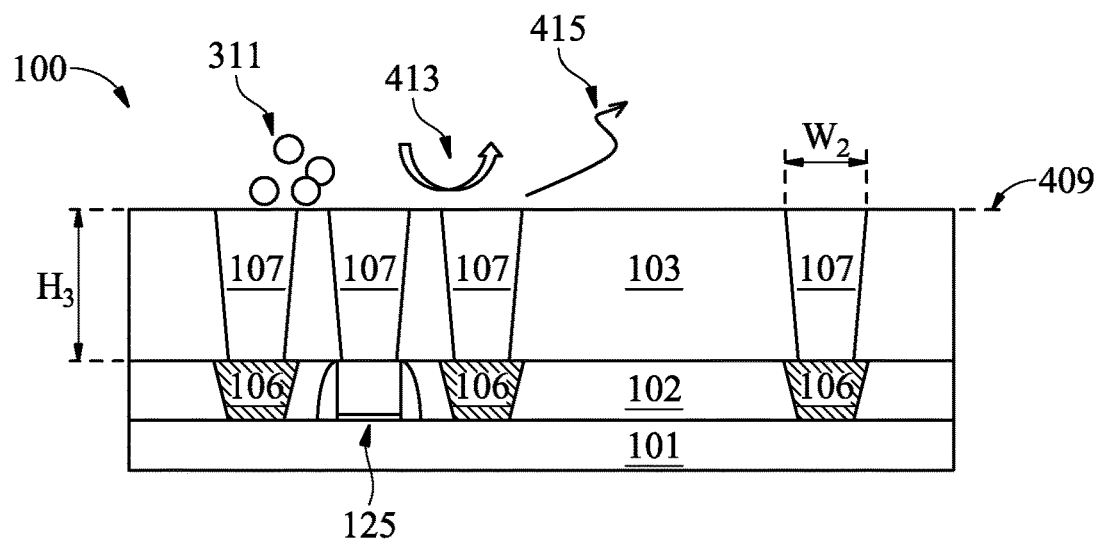

FIGS. 4A-4B illustrate the process and result of a buffing CMP process 400 performed on the workpiece 100. In an embodiment the workpiece 100 may be removed from the high-rate platen 207 and may be transferred to the buffing platen 211 (see FIG. 2), where the workpiece 100 may be attached to a second carrier 404, which also faces the outer surfaces of the second conductive fill material 105 and outer surfaces of the second ILD layer 103 being coincident the outer surface of the workpiece 100 towards a second polishing pad 402 on the buffing platen 211. The second polishing pad 402 may perform a similar CMP process as the high-rate platen 207, with the second polishing pad 402 grinding away the second conductive fill material 105 of the contact plugs 107 and the material of the second ILD layer 103 from the outer surface of the workpiece 100 to the second target level 409. In addition, the buffing CMP process 400 may include a buffing CMP slurry 405 being dispersed by a buffing slurry dispenser 407 to aid in the grinding process. In an embodiment the buffing CMP slurry 405 may comprise a reactant, an abrasive, a surfactant, and a solvent.

In some embodiments, the buffing CMP slurry 405 may include one or more of the first reactant 313, the abrasive 311, the first surfactant, and the solvent that is used in the bulk CMP slurry 305 for the bulk CMP process 300. However, any suitable reactant, abrasive, surfactant, solvent, and/or corrosion inhibitor may be utilized as the second reactant, the second abrasive, the second surfactant, the second solvent, and/or the corrosion inhibitor without departing from the spirit and scope of the embodiments described herein.

Once mixed, the buffing CMP slurry 405 may be dispensed onto the second polishing pad 402 by the buffing slurry dispenser 407. In an embodiment, the buffing CMP slurry 405 may be dispensed onto the second polishing pad 402 at a rate of between about 2000 sccm and about 100 sccm. In addition, the workpiece 100 may be forced into contact with the second polishing pad 402 by the second carrier 404 pressing the surface of the workpiece 100 against the second polishing pad 402. In an embodiment of the buffing CMP process 400, the second carrier 404 may push the workpiece 100 onto the buffing platen 211 with a force of between about 500 hpa to about 50 hpa, such as about 200 hpa. As the buffing platen 211 rotates the second polishing pad 402 underneath the workpiece 100, the buffing CMP slurry 405 is applied to the exposed surface of the workpiece 100 in order to assist in the removal of the second conductive fill material 105 and the materials of the second ILD layer 103. In an embodiment, during the buffing CMP process 400, the buffing platen 211 rotates at a speed of between about 30 rpm to about 300 rpm while the second carrier 404 rotates the workpiece 100 at a speed of about 30 rpm to about 300 rpm.

By rotating the second polishing pad 402 and the workpiece 100 against each other using the buffing CMP slurry 405, the second polishing pad 402 along with the assistance of the abrasive 311 in the buffing CMP slurry 405 mechanically grinds away the second conductive fill material 105 of the contact plugs 107 and the dielectric material of the second ILD layer 103, thereby effectuating a removal of excess materials of the second conductive fill material 105 and effectuating a removal of excess materials of the second ILD layer 103 at comparable rates of removal. In an embodiment, the buffing CMP process 400 may remove a portion of the second conductive fill material 105 of the contact plugs 107 at a first comparable rate of removal and a portion of the second ILD layer 103 at a second comparable rate of removal. In an embodiment, the first comparable rate of removal of the second conductive fill material 105 of the contact plugs 107 is between about 10 Å per minute and about 2000 Å per minute, such as about 200 Å per minute and the second comparable rate of removal of the excess materials of the second ILD layer 103 is between about 10 Å per minute and about 2000 Å per minute, such as about 200 Å per minute.

In an embodiment in which the second conductive fill material 105 of the contact plugs 107 is ruthenium (Ru) and the materials of the second ILD layer 103 include an oxide (e.g., oxide film), a second reactant 413 may react with the ruthenium (Ru) of the second conductive fill material 105 and may have little to no reaction with the oxide of the materials of the second ILD layer 103. In this manner, a sacrificial layer of ruthenium oxide ($RuO_2$) (not shown) is formed along exposed surfaces of the second conductive fill material 105 and the oxide of the materials of exposed surfaces of the second ILD layer 103 remain relatively unchanged by the second reactant 413. The ruthenium oxide and the oxide of the materials of the second ILD layer 103 may then be removed by the grinding effect of the second polishing pad 402 along with the assistance of the abrasive 311 within the buffing CMP slurry 405.

In an embodiment the second polishing pad 402 may be a soft buffing pad which may remove the second conductive fill material 105 and the materials of the second ILD layer 103 at a slower and more controlled rate than the first polishing pad 303 removed the second conductive fill material 105 while also buffing and eliminating defects and scratches that may have been caused by the bulk CMP process 300. In an embodiment the second polishing pad 402 may be rotated relative to the workpiece 100 while the buffing CMP slurry 405 is dispensed on the second polishing pad 402.

In an embodiment, the ruthenium oxide of the exposed portions of the second conductive fill material 105 may then be removed by the grinding effect of the second polishing pad 402 along with the assistance of the abrasive 311 within the buffing CMP slurry 405 at an effective boosted removal rate. The materials and the ratios selected for the plurality of abrasives mixed in the buffing CMP slurry 405 may be selected to have a desired first removal rate for the ruthenium (Ru) of the plug material and may have a desired second removal rate for the dielectric material of the second ILD layer 103. In some embodiments, the second removal rate may be different from the first removal rate. In other embodiments, the second removal rate may be comparable to the first removal rate.

In an embodiment, the ruthenium oxide of the exposed portions of the second conductive fill material 105 may be removed at a rate comparable to the rate of removal of the dielectric materials along exposed portions of the second ILD layer 103 which may lead to better WiD loading and planarization of a surface for a flat profile. In a hybrid abrasive system, the abrasives can perform a chemical reaction with the oxidizer and/or perform a chemical reaction directly with the second conductive fill material 105 (e.g., ruthenium (Ru)) to produce a free radical used in a subsequent mechanical polishing process. In addition, ratios between particulates of a hybrid abrasive may be adjustable which may allow for the CMP slurry to be fine-tuned and applied on different film schemes and different layouts in all generations of technology products (e.g., N5 node and beyond).

Using this buffing CMP process 400, a removal of the second conductive fill material 105 and a removal of the material of the second ILD layer 103 may be performed at a substantially same rate of buffing removal, and the buffing CMP process 400 may be continued until the second conductive fill material 105 and materials of the second ILD layer 103 are removed from the outer surface of the workpiece 100 to the second target level 409. Therefore, using the buffing CMP process 400 avoids under polishing of the second conductive fill material 105 and avoids over-polishing the materials of the second ILD layer 103 of the workpiece 100. In addition, issues such as pitting and/or dishing of the second conductive fill material 105 and under removal of the materials of the second ILD layer 103 may also be avoided using the buffing CMP process 400. Therefore, the buffing CMP process 400 using the buffing CMP slurry 405 with the hybrid abrasive allows for a finely planarized surface of the workpiece 100 and allows for better WiD loading (e.g., a testkey thickness through different pattern densities in a die) and planarization for providing a flat profile.

The buffing CMP process 400 may be continued until the second conductive fill material 105 of the contact plugs 107 and the materials of the second ILD layer 103 have been removed from the outer surface of the workpiece 100 to the second target level 409. In some embodiments, the buffing CMP process 400 may use a timed or optical end-point detection to determine when to stop at the second target level 409.

FIG. 4B illustrates a result of the buffing CMP process 400, wherein the excess conductive fill material 105 of the contact plugs 107 and the excess materials of the second ILD layer 103 have been removed from the outer surface of the workpiece as desired. In an embodiment, a portion of the second conductive fill material 105 of the contact plugs 107 and a portion of the materials of the second ILD layer 103 are removed during the buffing CMP process 400 such that the workpiece 100 is further reduced from the second height $H_2$ (shown in FIG. 3B) to the third height $H_3$, such that contact areas (not shown) on a first end of the contact plugs 107 are exposed at an outer surface of the workpiece 100, and such that a remaining portion of the workpiece 100, between the second target level 409 and the substrate 101, is left intact.

In addition, during the removal of the second conductive fill material 105 of the contact plugs 107, the materials of the buffing CMP slurry 405 and materials of the second conductive fill material 105 react such that a byproduct 415 may be formed. In some reactions between materials, the byproduct 415 may be formed as a vapor; while in other reactions, the byproduct 415 may have a form different than a vapor (e.g., liquid or solid). Furthermore, in some reactions between materials, the byproduct 415 may be formed as a toxic gas while in other reactions the byproduct 415 may be formed as a non-toxic gas, as discussed above with regard to the byproduct 315 of the bulk CMP process 300 and FIG. 3B. However, still other reactions between materials may also occur during the buffing CMP process 400 depending on the materials of the buffing CMP slurry 405 and materials of the workpiece 100 resulting in other byproducts 415 being formed.

FIG. 4B illustrates the result of the buffing CMP process 400. As illustrated, the buffing CMP process 400 uses the one or more abrasives 311 and the second reactant 413 to aid in the removal of excess materials of the second conductive fill material 105 of the contact plugs 107 and the materials of the second ILD layer 103 from the outer surface of the workpiece 100 to the second target level 409. As further illustrated in FIG. 4B, the resulting structure of the workpiece 100 includes the second conductive fill material 105 of the contact plugs 107 isolated within the contact openings of the second ILD layer 103 with outer surfaces of the second conductive fill material 105 forming contact areas of the contact plugs 107 and outer surfaces of the second ILD layer 103 being coincident the outer surface of the workpiece 100. In an embodiment, once the workpiece is reduced to the second target level 409, the contact areas of the contact plugs 107 may have a second width $W_2$. In an embodiment, the second width $W_2$ may be between about 100 nm and about 1 nm, such as about 20 nm. However, any suitable width may be used.

However, as one of ordinary skill in the art will recognize, the above description of removing the excess conductive fill material 105 and the excess materials of the second ILD layer 103 between the first target level 309 and the second target level 409 in a single processing step is merely an illustrative example and is not intended to be limiting upon the embodiments. Any number of removal processes and any number of platens may be utilized to remove the excess conductive fill material 105 and excess materials of the second ILD layer 103, and all such combinations are fully intended to be included within the scope of the embodiments.

However, after the buffing CMP process 400, residual particles such as the abrasive 311 (e.g., titanium oxide ($TiO_2$)) may be attracted to the surfaces of the second conductive fill material 105 of the contact plugs 107 and/or may be attracted to the surfaces of the second ILD layer 103. This attraction is due to differences between charges of the residual particles and surface charges of the second conductive fill material 105 of the contact plugs 107 and/or surface charges of the materials of the second ILD layer 103. Additionally, residual organic material from the bulk CMP process 300 and the buffing CMP process 400 may become attached to the outer surface of the workpiece 100. This organic material may originate, e.g., as debris from the first polishing pad 303, the second polishing pad 402, the first surfactant within the bulk CMP slurry 305, the second surfactant within the buffing CMP slurry 405, pipeline debris, or other debris from the bulk CMP process 300 and the buffing CMP process 400.

To clean the residual particles and/or the organic material from the surface of the workpiece 100, a cleaning buffing CMP process (not separately illustrated) may be performed. In an embodiment the cleaning buffing CMP process may be performed utilizing the buffing platen 211 and the second polishing pad 402 as the buffing CMP process 400 described above with respect to FIG. 4A. In a particular embodiment the cleaning buffing CMP process may be performed at the back end of the buffing CMP process 400 by simply changing the buffing slurry dispenser 407 from dispensing the buffing CMP slurry 405 to a cleaning solution. However, as one of ordinary skill in the art will recognize, the cleaning buffing CMP process may also be performed on a separate platen with a separate polishing pad than the buffing CMP process 400 while still remaining within the scope of the embodiments.

According to some embodiments, the cleaning buffing CMP process may be performed using a cleaning solution that may comprise a cleaning reactant, an optional cleaning surfactant, and the solvent without the use of abrasives. In an embodiment the cleaning reactant may be a chemical which can help to remove the contaminated layer and its contaminants. For example, excess material debris s of the second conductive fill material 105 of the contact plugs 107 and excess materials of the second ILD layer 103 may be removed from the outer surface of the workpiece 100. In an embodiment, the cleaning reactant may be phosphoric acid ($H_3PO_4$), although other suitable chemicals, such as citric acid or oxalic acid, may also be utilized. The cleaning reactant may be between about 0.1% to about 99% of the cleaning solution, such as about 5% of the cleaning solution.

In addition, after the cleaning buffing CMP process, the substrate 101 may be moved to the cleaning station 205 (see FIG. 2), where an additional brush cleaning process and/or pencil brush cleaning process may be performed in order to further clean the surface of the workpiece 100. Without the residual particles and residual organic materials present during later manufacturing steps, fewer defects may occur, thereby leading to an overall improvement in quality and yield for the manufacturing process.

Figure 5:
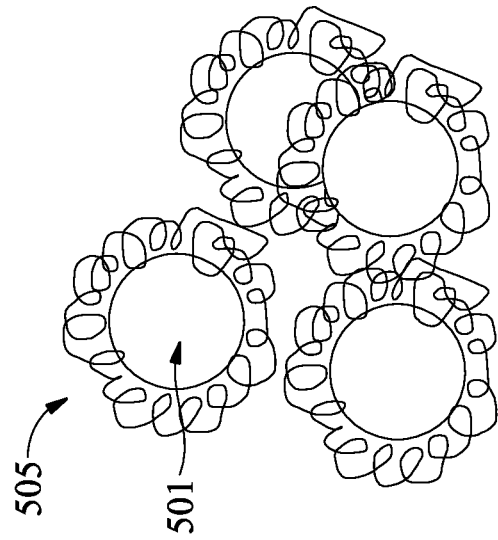
FIG. 5 illustrates examples of some abrasives used to form a slurry, in accordance with some embodiments.
Figure 5:
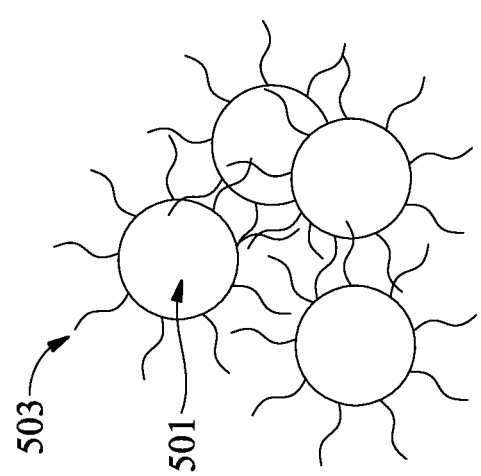

FIG. 5 illustrates various abrasive coatings that may be selected individually or selected in any combination to provide coatings for the abrasive 311 used in mixing the bulk CMP slurry 305 during the bulk CMP process 300 (shown and discussed above with regard to FIGS. 3A-3B) and/or to provide coatings for the abrasive 311 used in mixing the buffing CMP slurry 405 during the buffing CMP process 400 (shown and discussed above with regard to FIGS. 4A-4B). The various coatings illustrated in FIG. 5, include a first coating 503 and a second coating 505.

The first coating 503 provided for abrasives 501 may be an organic coating such as organic polymer, an organic surfactant (e.g., functional groups of COOH, OH, $NH_3$, etc.) that may provide a negative or a positive charges allowing for the use of attractive and repulsive forces, if desired, according to some embodiments. However any other suitable organic coating may be used as the first coatings 503 and any combinations of these, or the like, may also be utilized and are fully intended to be included within the scope of the embodiments.

The second coating 505 provided for abrasives 501, may be an inorganic coating such as an oxide coating or an aluminum coating (e.g., Ox, Al), according to some embodiments. However any other suitable inorganic coating may be used as the second coating 505 and any combinations of these, or the like, may also be utilized and are fully intended to be included within the scope of the embodiments.

In the CMP processes described herein, a ruthenium (Ru) layer (e.g., the second conductive fill material 105) may be polished using titanium oxide ($TiO_2$) and $TiO_2$ hybrid abrasives which can provide different selectivity on ruthenium (Ru) and dielectrics (e.g., oxide films) during CMP of a surface of a workpiece 100 which leads to better planarization and WiD loading. In an embodiment, the buffing CMP slurry 405 includes a hybrid abrasive, for example, a first particulate with $TiO_2$ particles and a second particulate with $SiO_2$ particles, that provides a hybrid selectivity-balanced system with a removal rate of ruthenium (Ru) that is comparable to a removal rate of dielectric materials. With the buffing CMP slurry 405, the hybrid abrasive allows for relatively weak oxidizers (e.g., $H_2O_2$) to be utilized as the second reactant 413 which reacts with the ruthenium (Ru) producing a safer byproduct 415 (e.g., $Ru(OH)_3$) rather than producing a toxic byproduct (e.g., $RuO_4$). Thus, a safer environment is maintained for the handlers and an overall more friendly environmental gas is emitted. Meanwhile, the bulk CMP slurry 305 and the buffing CMP slurry 405 using $TiO_2$ abrasives and/or $TiO_2$ hybrid abrasives, can effectively boost a rate of removal of ruthenium (Ru) and can be adaptable to provide different selectivity of ruthenium (Ru) and to provide different selectivity of dielectrics. Accordingly, these CMP processes described herein can effectively reduce process time, process cost, and enlarge the process window.

In addition, the slurry may be made to be highly selective for different film schemes and layouts by adjusting a ratio between particulates of the hybrid abrasive. Thus, the CMP processes described herein may be applied to workpieces 100 in the middle end of the line (MEOL) stages for structures such as the source/drain plugs 106 and may be adapted and applied to workpieces in the back end of the line (BEOL) stages for structures such as the contact plugs 107. Furthermore, the CMP processes described herein may be highly suitable for all generations of technologies (e.g., N20, N16, N10, etc.) including N5 node and beyond.

In an embodiment, a method of manufacturing a semiconductor device includes applying a slurry to a surface of a workpiece, wherein at least one portion of the surface of the workpiece includes ruthenium; forming a ruthenium oxide layer at the at least one portion of the surface of the workpiece from a chemical reaction between an oxidizer of the slurry and the ruthenium; removing the ruthenium oxide layer and other portions of the surface of the workpiece using an abrasive material of the slurry, wherein the abrasive material includes a plurality of different particulate materials, at least one of the plurality of particulate materials including titanium dioxide particles. In an embodiment, the method includes producing a non-toxic byproduct from chemical reactions between the ruthenium of the at least one portion of the surface of the workpiece, the titanium dioxide particles of the abrasive material, and the oxidizer. In an embodiment, the producing a non-toxic byproduct includes producing ruthenium hydroxide. In an embodiment, the removing the ruthenium oxide layer and the other portions of the surface of the workpiece includes using a particulate material including silicon dioxide as another one of the plurality of particulates of the abrasive material. In an embodiment, the forming a ruthenium oxide layer at the surface of the at least one portion of the surface of the workpiece includes using hydrogen peroxide as the oxidizer. In an embodiment, the applying the slurry to the at least one portion of the surface of the workpiece includes applying the slurry to a surface of a ruthenium plug of a middle end of the line structure, the surface of the ruthenium plug being coincident the at least one portion of the surface of the workpiece.

In an embodiment, a method of manufacturing a semiconductor device, the method includes dispensing a chemical mechanical polishing (CMP) slurry on an outer surface of a workpiece, the workpiece including a ruthenium layer with a plurality of ruthenium plugs within an inter-layer dielectric (ILD) layer; using an oxidizer of the CMP slurry to form an oxide layer on surfaces of the ruthenium layer; and performing a CMP removal of the oxide layer using a first abrasive of the CMP slurry, wherein the first abrasive includes titanium oxide particles and silicon dioxide particles. In an embodiment, the performing the CMP removal of the oxide layer includes removing excess material of the plurality of ruthenium plugs of the ruthenium layer, and removing excess material of the ILD layer from the surface of the workpiece using the CMP slurry, wherein a rate of removal of the oxide layer combined with a rate of removal of the excess material of the ruthenium plugs during the CMP removal is comparable to a rate of removal of the excess material of the ILD layer. In an embodiment, performing the CMP removal of the oxide layer includes: exposing a contact area on an end of one of the plurality of ruthenium plugs at the surface of the workpiece, the exposed contact area being electrically coupled to a finFET device disposed at an opposite end of the ruthenium plug from the exposed contact area. In an embodiment, the CMP slurry includes a second abrasive including aluminum (II) dioxide particles. In an embodiment, the oxidizer of the CMP slurry is hydrogen peroxide. In an embodiment, the dispensing the CMP slurry on the outer surface of the workpiece includes dispensing the CMP slurry on an outer surface of a ruthenium layer of a middle end of the line structure. In an embodiment, the method further includes producing ruthenium hydroxide as a non-toxic byproduct from chemical reactions between the ruthenium layer, the titanium oxide of the first abrasive, and the oxidizer.

In an embodiment, a method of forming a slurry for chemical mechanical polishing (CMP) includes mixing a first abrasive with a solvent, the first abrasive including a first particulate material including titanium dioxide particles; mixing a second abrasive with the solvent, the second abrasive including a second particulate material that is different from the first particulate material; and mixing a reactant with the solvent, the reactant including an oxidizer. In an embodiment, the second particulate material includes silicon dioxide particles. In an embodiment, the second particulate material includes aluminum oxide particles. In an embodiment, the oxidizer includes hydrogen peroxide. In an embodiment, the mixing the first abrasive with the solvent includes providing an organic coating on the titanium dioxide particles. In an embodiment, the mixing the first abrasive with the solvent includes providing an inorganic coating on the titanium dioxide particles. In an embodiment, the method further includes mixing a surfactant with the solvent.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    overfilling an opening in a dielectric layer with a conductive material comprising ruthenium, the dielectric layer being located over a semiconductor substrate;
    converting a portion of the conductive material to an oxide using an oxidizer;
    applying a first abrasive to the oxide;
    grinding the oxide with a pad to remove at least a portion of the oxide with the first abrasive; and
    after grinding the oxide, buffering the conductive material and the dielectric layer, wherein the buffering the conductive material and the dielectric layer removes material of the conductive material and the dielectric layer at a substantially same rate.

2. The method of claim 1, wherein the ruthenium is part of a middle end of line structure.

3. The method of claim 1, wherein the first abrasive is part of a first slurry, and the applying the first abrasive dispenses the first slurry directly onto the ruthenium.

4. The method of claim 1, further comprising applying a second abrasive to the oxide, the second abrasive different from the first abrasive.

5. The method of claim 1, further comprising producing a non-toxic byproduct from chemical reactions between the ruthenium and the oxidizer.

6. The method of claim 5, wherein the producing the non-toxic byproduct comprises producing ruthenium hydroxide.

7. A method of manufacturing a semiconductor device, the method comprising:
    depositing ruthenium into an opening of a dielectric material, the ruthenium being electrically coupled to a finFET device; and
    polishing the ruthenium, wherein the polishing the ruthenium further comprises:
        applying an oxidizer to the ruthenium; and
        applying one or more abrasives to the ruthenium, wherein during the polishing the ruthenium a byproduct is produced, the byproduct being ruthenium hydroxide.

8. The method of claim 7, wherein the polishing the ruthenium also polishes the dielectric material, a first rate of removal of the ruthenium being comparable to a second rate of removal of the dielectric material.

9. The method of claim 7, wherein the oxidizer is hydrogen peroxide.

10. The method of claim 7, wherein the polishing the ruthenium further comprises applying guanidine to the ruthenium.

11. The method of claim 7, wherein the one or more abrasives is two or more abrasives, at least one of the two or more abrasives comprising aluminum (II) dioxide.

12. The method of claim 11, wherein at least one of the two or more abrasives comprises silicon oxide.

13. A method manufacturing a semiconductor device, the method comprising:
    reacting a first portion of ruthenium with an oxidizer in order to form ruthenium hydroxide, at least a second portion of the ruthenium being located within a dielectric material over a substrate;
    grinding with a high-rate platen the first portion of the ruthenium with a first abrasive and a second abrasive, the grinding the first portion removing the first portion to expose a first surface of the second portion, the first surface having a first width, and
    grinding with a buffing platen the second portion to expose a second surface of the second portion, the second surface having a second width between about 1 nm and about 20 nm, the second width being more narrow than the first width.

14. The method of claim 13, wherein the oxidizer comprises hydrogen peroxide.

15. The method of claim 13, wherein the first abrasive has an organic coating.

16. The method of claim 13, wherein the second abrasive has an inorganic coating.

17. The method of claim 13, wherein the first abrasive and the second abrasive are located within a solvent.

18. The method of claim 7, wherein the ruthenium has a width that is reduced by the polishing.

19. The method of claim 13, wherein the second abrasive comprises titanium dioxide.

20. The method of claim 19, wherein the first abrasive comprises aluminum oxide.

* * * * *